United States Patent [19]
Goode et al.

[11] Patent Number: 5,903,825
[45] Date of Patent: May 11, 1999

[54] DIGITAL FM RECEIVER BACK END

[75] Inventors: Steven Howard Goode, Barrington; James Clark Baker, Crystal Lake; Michael John Carney, Mundelein, all of Ill.

[73] Assignee: Motorola, Inc., Schaumburg, Ill.

[21] Appl. No.: 08/671,385

[22] Filed: Jun. 27, 1996

[51] Int. Cl.$^6$ ...................................................... H04B 1/16
[52] U.S. Cl. .......................... 455/205; 455/214; 455/337; 455/296; 375/375
[58] Field of Search ..................................... 455/205, 209, 455/210, 214, 337, 296, 303, 304, 305, 307, 314, 323; 375/346, 371, 375; 329/315, 341, 342, 343

[56] References Cited

U.S. PATENT DOCUMENTS

| | | |
|---|---|---|
| 4,021,744 | 5/1977 | Montefusco . |
| 5,084,669 | 1/1992 | Dent . |
| 5,202,901 | 4/1993 | Chennakeshu et al. . |
| 5,299,232 | 3/1994 | LaRosa et al. ........................... 375/346 |
| 5,367,538 | 11/1994 | LaRosa et al. . |
| 5,398,003 | 3/1995 | Heyl et al. ................................. 330/10 |
| 5,461,643 | 10/1995 | LaRosa et al. . |
| 5,475,307 | 12/1995 | Silvian . |
| 5,495,204 | 2/1996 | Hilby . |
| 5,661,433 | 8/1997 | LaRosa et al. ........................... 455/214 |
| 5,754,455 | 5/1998 | Baker et al. ........................ 364/724.17 |
| 5,771,182 | 6/1998 | Baker et al. ........................ 364/715.02 |
| 5,793,315 | 8/1998 | Baker ........................................ 333/14 |

OTHER PUBLICATIONS

Protopapas, *Microcomputer Hardware Design*, pp. 342–359, 1988.

"High Fidelity Switching Audio Amplifiers Using TMOS Power MOSFETs" by Donald E. Pauly, *Motorola Semidonductor Application Note #AN1042/D*, 1989, pp. 1–11.

"Compact NMOS Building Blocks and a Methodology for Dedicated Digital Filter Applications," by Johan K.J. Van Ginderdeuren, Hugo J. De Man, Nelson F. Goncalves, and Wilhelmus A.M. Van Noije, *IEEE Journal of Solid–State Circuits*, vol. SC–18, No. 3, Jun. 1983, pp. 306–316.

*Primary Examiner*—Doris H. To
*Attorney, Agent, or Firm*—Sylvia Chen

[57] ABSTRACT

The digital FM receiver back end receives an analog intermediate frequency signal from a radio frequency front end (310) having a heterodyne circuit (312) and an intermediate frequency filter (314). In the receiver back end (307), a digital demodulator (330) having a hard limiter (333), a direct phase digitizer (336), and a phase differential circuit (339) produces a digital phase differential signal from the analog intermediate frequency signal. Next, a digital processor (360) filters and reduces noise in the digital phase differential signal using a bandpass filter (362), a de-emphasis filter (364), and an expandor (366). Finally, a pulse-width-modulation audio amplifier (380) prepares the signal for reproduction on an audio speaker (390). The digital FM receiver back end avoids inherent DC offset problems common to analog FM receivers, and it also offers a reduced complexity, size, and power consumption alternative to conventional digital FM receivers.

13 Claims, 3 Drawing Sheets

DIGITAL FM RECEIVER BACK END

CROSS-REFERENCE TO RELATED APPLICATIONS

This application is related to application Ser. No. 08/671, 036 entitled "Digital FM Demodulator" by Christopher P. LaRosa and Michael J. Carney (Attorney Docket No. CE00950R) filed same date herewith now U.S. Pat. No. 5,661,433. This application also is related to application Ser. No. 08/631,321 entitled "Method and Apparatus for Setting a Bit-Serial Filter to an All-Zero State" by James C. Baker and Denise Riemer (Attorney Docket No. CE01069R) filed Apr. 10, 1996 now U.S. Pat. No. 5,754,455; application Ser. No. 08/659,104 entitled "Bit-Serial Digital Compressor" by James C. Baker and John Oliver (Attorney Docket No. CE01239R) filed May 31, 1996 now U.S. Pat. No. 5,771, 182; and application Ser. No. 08/656,131 entitled "Bit-Serial Digital Expandor" by James C. Baker (Attorney Docket No. CE01070R) filed May 31, 1996 now U.S. Pat. No. 5,793, 315. The specifications of these applications are incorporated herein by reference.

FIELD OF THE INVENTION

This invention relates generally to frequency modulation (FM) receivers, and more particularly to a digital FM receiver back end with reduced complexity, size, and power consumption.

BACKGROUND OF THE INVENTION

Frequency modulation is one of the most common methods of transmitting analog voice signals across a communication channel. This method has been used in a wide variety of applications including cellular communications systems in the United States, Japan, and Europe.

A conventional analog approach to receiving FM signals includes a radio frequency (RF) front end that uses a heterodyne circuit to step down a received signal to an intermediate frequency (IF). In the receiver back end, an analog FM demodulator converts the signal to baseband using a discriminator with a tuning coil. Next, an analog processor in the receiver back end filters and adjusts the gain of the signal from the analog demodulator to produce a recovered signal that is then sent to an audio speaker. This analog approach, however, has several drawbacks due to the tuning requirements of the analog discriminator and the direct current (DC) offsets inherent in analog circuitry.

A digital approach to receiving FM signals, on the other hand, avoids the aforementioned problems of analog discriminator circuitry. In this situation, the RF front end is identical to an analog RF front end, while the receiver back end includes a digital FM demodulator that converts the IF signal to the digital domain, extracts the modulating signal, and sends it to a digital processor for filtering and gain adjustment. The output of the digital processor is then converted back into the analog domain, amplified, and sent to an audio speaker. Unfortunately, size and current drain requirements typically render conventional digital FM receivers impractical for low-cost, portable applications.

Thus, there is a need for an FM receiver that not only avoids the problems common to analog discriminator circuitry, but also offers a reduced size and power consumption alternative to conventional digital FM receivers.

DETAILED DESCRIPTION OF THE PREFERRED EMBODIMENT

The digital FM receiver back end eliminates the analog-to-digital (A/D) and digital-to-analog (D/A) conversion and high-speed digital signal processing requirements of conventional digital FM receiver approaches. Instead, an output from a hard limiter in the digital FM receiver back end is interpreted as a one-bit digital signal and this digital signal is processed using a bit-serial architecture. Because high-speed processing is no longer required, the digital FM receiver back end can be readily integrated into a custom integrated circuit for use in a space- and power-critical application such as a radiotelephone. Thus, the digital FM receiver back end not only avoids the inherent problems common to analog discriminator circuitry, but it also offers a reduced complexity, size, and power consumption alternative to conventional digital FM receivers.

The digital FM receiver back end receives an IF signal from an RF front end including a heterodyne circuit. In the digital FM receiver back end, a digital demodulator having a hard limiter, a direct phase digitizer, and a phase differential circuit produces a digital phase differential signal from the IF signal. Next, a digital processor filters and reduces noise in the digital phase differential signal using a bandpass filter, a de-emphasis filter, and an expandor. Finally, a pulse-width-modulation (PWM) audio amplifier uses a complementary transistor output stage to prepare the signal for reproduction on an audio speaker.

Figure 1:
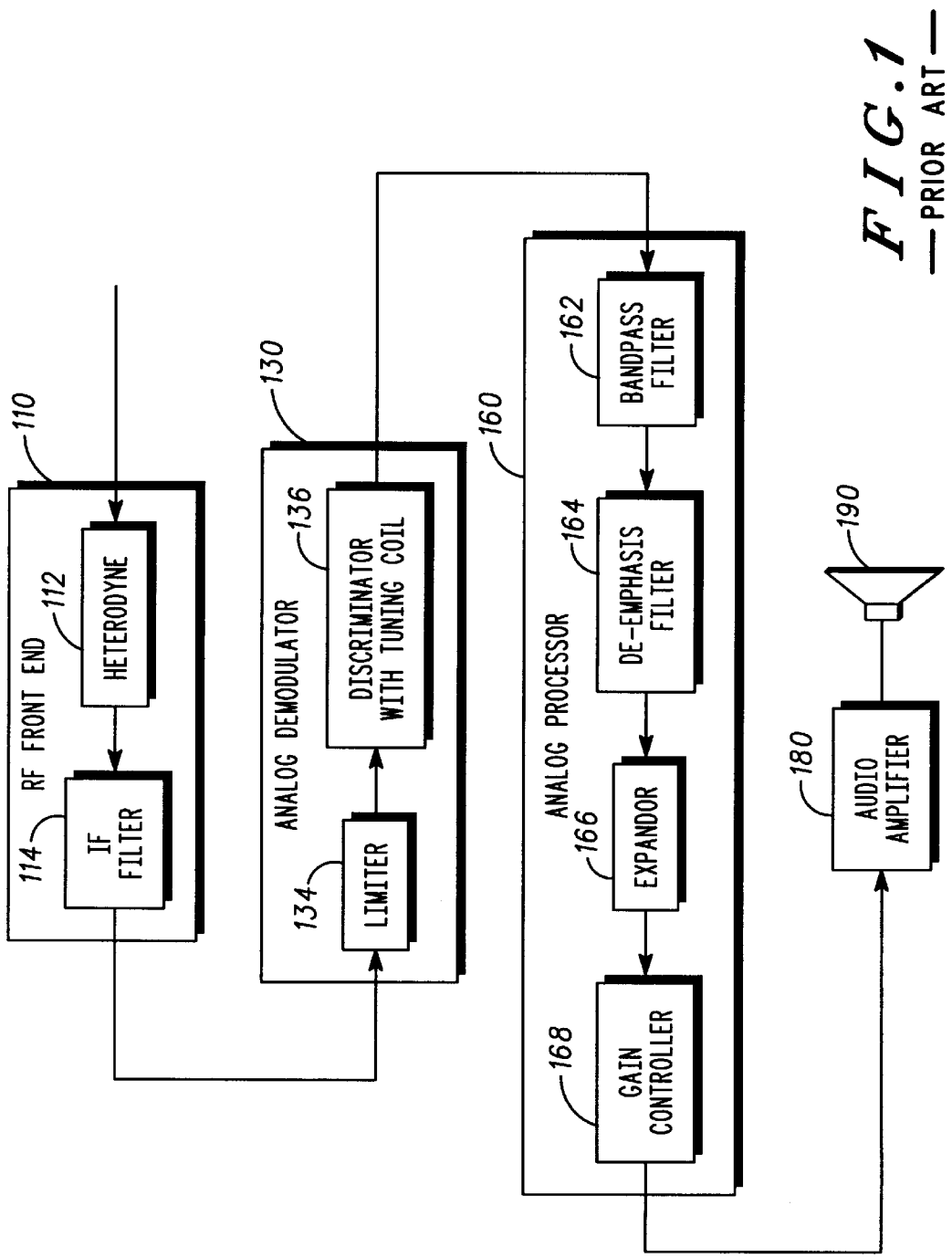
FIG. 1 shows a block diagram of a prior art analog FM receiver.

FIG. 1 shows a block diagram of a prior art analog FM receiver. RF front end 110 takes an RF signal from an antenna and steps down the signal to an intermediate frequency using a heterodyne circuit 112 and filters it using IF filter 114. Analog FM demodulator 130 contains a limiter 134 to remove noise-induced amplitude modulation from the input IF signal, and a discriminator with tuning coil 136 to convert frequency deviations in the IF signal to voltage level deviations which creates a baseband signal.

The baseband signal is then brought into analog processor 160 where bandpass filter 162 eliminates frequency bands that are not of interest. For example, a bandpass filter with a passband of 300 Hz to 3 kHz could be used to limit the input signal to an audio speech frequency band. Next, de-emphasis filter 164 compensates for high-frequency noise amplification at the output of the discriminator. Expandor 166 restores compressed signals, and gain controller 168 amplifies the expanded signal. Analog processor 160 uses switched-capacitor technology for each block in the processor, and it often encounters difficulties due to inherent DC offsets of the analog circuitry.

At the output of analog processor 160, audio amplifier 180 uses operational amplifiers to increase the gain of the signal and sends it to audio speaker 190.

Figure 2:
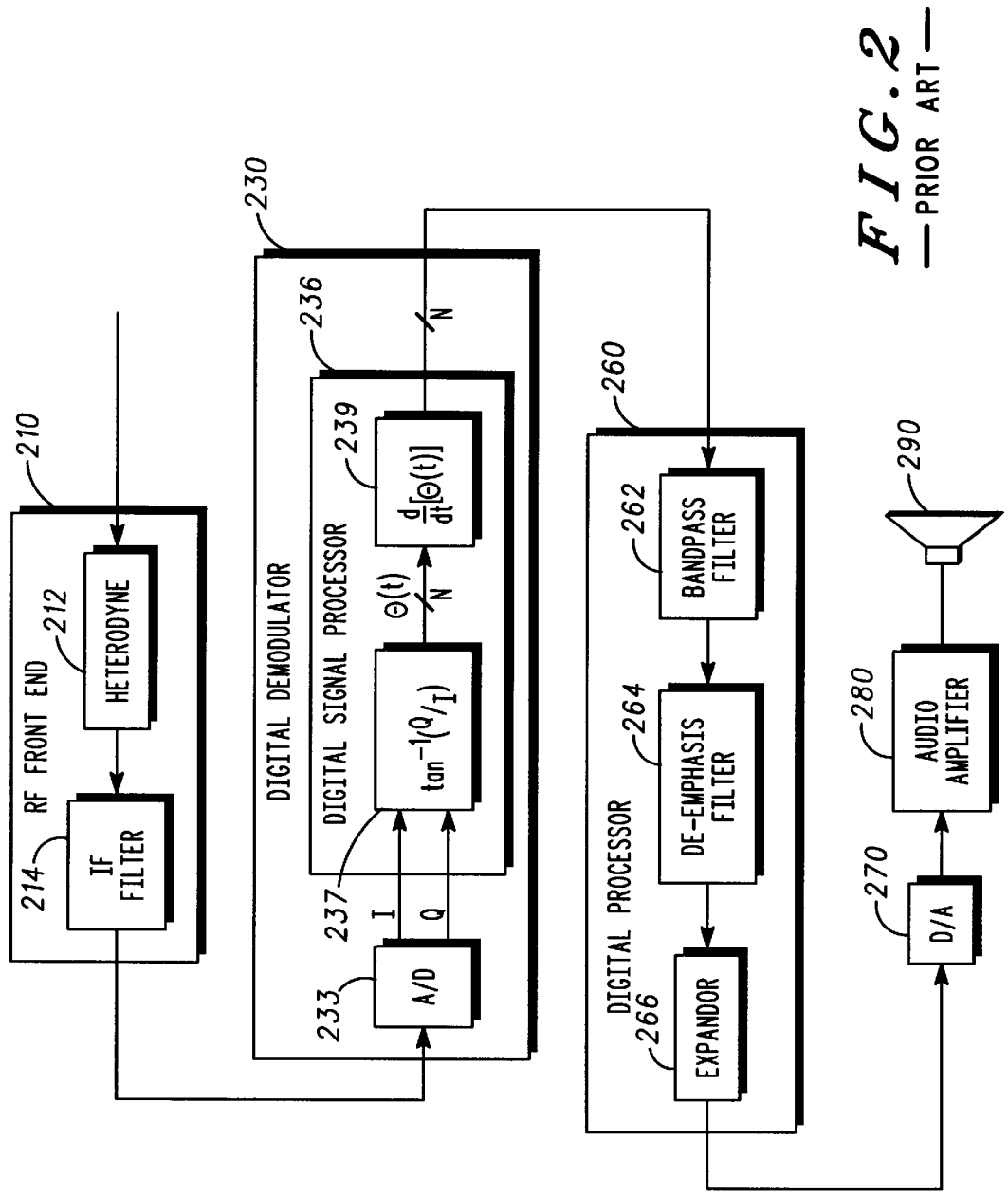
FIG. 2 shows a block diagram of a prior art digital FM receiver.

FIG. 2 shows a block diagram of a prior art digital FM receiver. Similar to an analog FM receiver, RF front end 210 steps down an RF signal from an antenna to an intermediate frequency using a heterodyne circuit 212 and filters the signal using IF filter 214. In digital demodulator 230, A/D converter 233 operating at a high clock speed converts the IF signal to baseband in-phase and quadrature (I/Q) signals. High-speed digital signal processor 236 includes arctangent block 237, which computes or looks up phase information based on the I/Q signals, and differentiation block 239, which performs high-speed differentiation of the phase information to produce an output signal containing desired frequency information. Digital processor 260 includes a digital bandpass filter 262, de-emphasis filter 264, and expandor 266. Digital signal processor 236 and digital processor 260 are implemented on a single general-purpose digital signal processing chip using parallel infinite-duration impulse response filters or parallel finite-duration impulse response filters. At the output of digital processor 260, D/A converter 270 converts the digital output signal to the analog domain, and audio amplifier 280 uses operational amplifiers to increase the gain of the recovered signal for reproduction through audio speaker 290.

Figure 3:
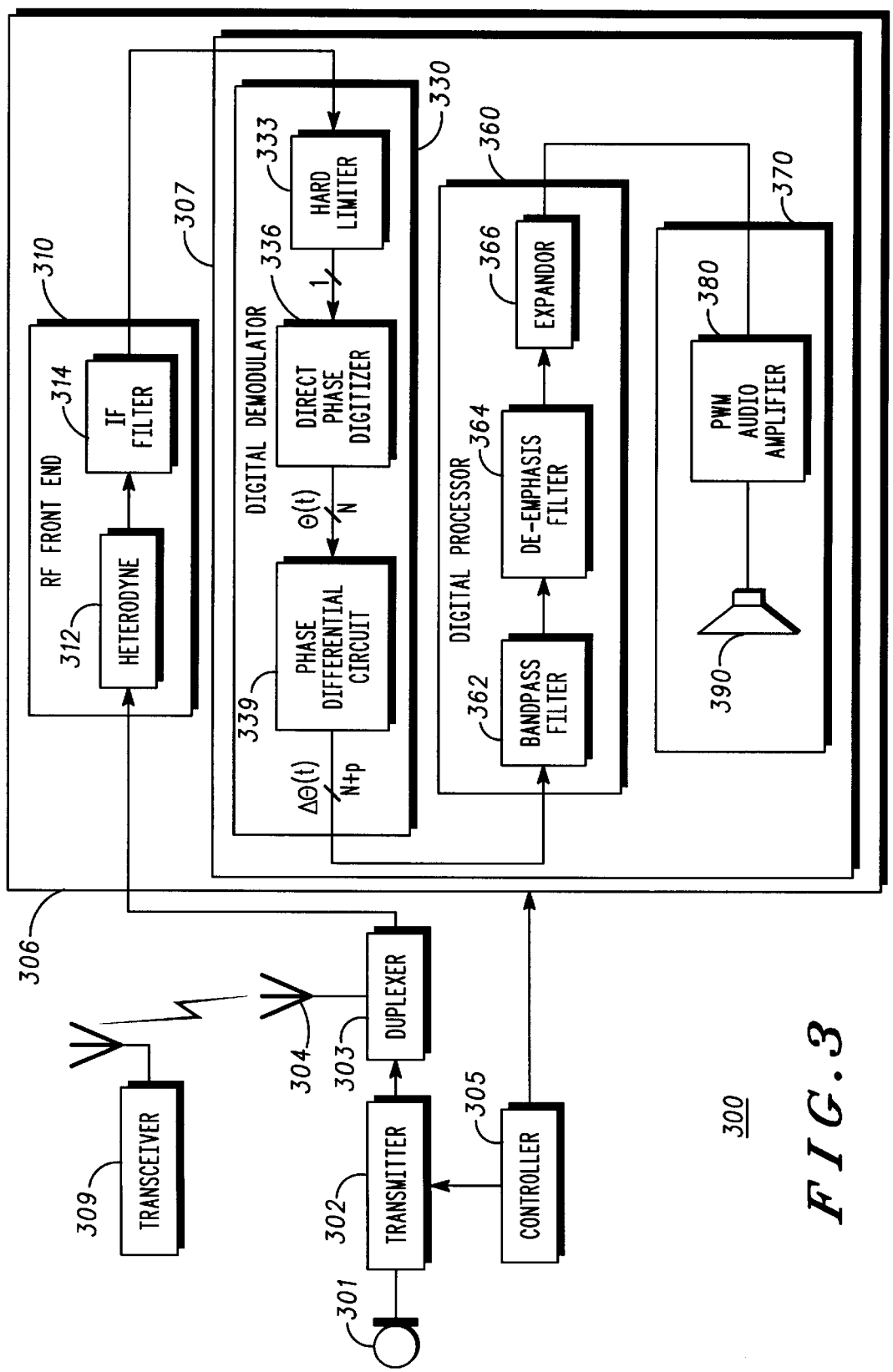
FIG. 3 shows a block diagram of a digital FM receiver according to a preferred embodiment as implemented in a communication device.

FIG. 3 shows a block diagram of a digital FM receiver back end according to a preferred embodiment as implemented in a communication device. The illustrated communication device 300 having a digital FM receiver 306 is a radiotelephone; however, digital FM receiver 306 can be employed in a MODEM (modulator/demodulator), two-way radio, land-line telephone, recording instrument, cellular telephone, cordless telephone, radio frequency receiver, or any other analog receiver device.

Transmitter 302 and receiver 306 in communication device 300 operate under the control of controller 305, which can be implemented using a microprocessor, a digital signal processor, or the like. An antenna 304 is coupled to both transmitter 302 and receiver 306 via a duplexer 303. Antenna 304 emits signals generated by transmitter 302 from microphone 301 for transmission to a complementary communication device 309 having a transceiver and an antenna. Antenna 304 also receives radio frequency signals imparted to communication device 300 from complementary communication device 309.

In the receiver 306, RF front end 310 has a heterodyne circuit 312 or the like and IF filter 314 receives a modulated RF signal from complementary communication device 309 through antenna 304 and duplexer 303. RF front end 310 produces an analog IF signal that is sent to receiver back end 307. In digital demodulator 330, the IF signal is amplified and limited to two voltage levels by hard limiter 333. Next, direct phase digitizer circuit 336 uses a high-frequency reference clock to estimate the time between zero-crossings of the limited IF signal. This estimate is mapped into an N-bit word θ(t) representing the phase of the limited IF signal relative to the reference clock. Because phase information is extracted directly from the limited IF signal, no dedicated A/D converter is required which reduces the size and current drain of the digital FM receiver 306 relative to conventional digital FM demodulator approaches.

Phase differential circuit 339 computes the phase shift of the signal from direct phase digitizer circuit 336 over a predetermined time interval. This phase differential signal provides a digital representation of the transmitted analog modulating signal. As an option, the dynamic range of the phase differential signal can be increased by including one or more range expansion stages in the phase differential circuit 339. Each range expansion stage increases the digital word length of the phase differential signal by one bit. Thus, if N is the number of bits in a digital word from direct phase digitizer circuit 336, then p range expansion stages would result in an output word of digital demodulator 330 having N+p bits.

The phase differential signal is sent to digital processor 360 having bandpass filter 362, de-emphasis filter 364, and expandor 366. These three blocks use bit-serial digital processing architectures to filter and process the digital input signal which results in a lower current drain and gate count than equivalent parallel digital processing architectures. Bandpass filter 362 removes noise by passing only certain frequency bands. For example, bandpass filter 362 passes only frequency components between approximately 300 Hz and 3 kHz, thereby removing frequency components substantially outside of the voice band. De-emphasis filter compensates for high frequency noise amplification caused by the demodulation process. Finally, bit-serial digital expandor 366 performs expanding on the compressed input signal to restore the signal.

At the output of digital processor 360, converter block 370 converts the digital output into an audio signal. PWM audio amplifier 380 uses a converter to produce a PWM signal followed by a complementary transistor output stage to drive audio speaker 390. The converter may be a sigma-delta converter or another type of converter if desired. Then, audio speaker 390 converts the signal from PWM audio amplifier 380 into an audio signal. Note that no D/A converter is needed, thus reducing the size and current drain of the digital receiver back end relative to conventional FM receivers.

Thus a digital FM receiver back end provides an all-digital alternative to analog FM receiver back ends and a reduced size, complexity, and power consumption alternative to conventional digital FM receivers. While specific components and functions of the digital FM receiver back end are described above, fewer or additional functions could be employed by one skilled in the art within the true spirit and scope of the present invention. The invention should be limited only by the appended claims.

We claim:

1. A digital FM receiver back end comprising:
 a digital demodulator for demodulating an analog intermediate frequency signal to a digital baseband signal;
 a digital processor connected to the digital demodulator, for filtering the digital baseband signal using bit-serial digital processing, wherein the digital processor comprises:
  a bit-serial digital bandpass filter, for reducing the bandwidth of the digital baseband signal;
  a bit-serial digital de-emphasis filter connected to the bit-serial bandpass filter, for compensating for high frequency noise amplification in the digital baseband signal; and
  a bit-serial digital expandor connected to the bit-serial de-emphasis filter, for expanding the digital baseband signal; and
 a converter block connected to the digital processor, for converting the digital baseband signal to an analog baseband signal.

2. A digital FM receiver back end according to claim 1 wherein the converter block comprises:
 a pulse-width-modulation audio amplifier; and
 an audio speaker connected to the pulse-width-modulation amplifier.

3. A digital FM receiver back end according to claim 1 wherein the digital demodulator comprises:
 a hard limiter, for limiting the analog intermediate frequency signal to a limited intermediate frequency signal having two voltage levels;
 a direct phase digitizer connected to the hard limiter, for converting the limited intermediate frequency signal to a digital phase word; and a phase differential circuit connected to the direct phase digitizer, for converting the digital phase word to a digital phase differential word.

4. A digital FM receiver back end according to claim 3 wherein the digital phase differential word is one bit longer than the digital phase word.

5. A digital FM receiver back end according to claim 1 wherein the converter block comprises:

a sigma-delta converter.

6. An FM receiver comprising:

an FM receiver front end, for converting an analog radio frequency signal to an analog intermediate frequency signal; and an FM receiver back end comprising:
 a digital demodulator, for demodulating the analog intermediate frequency signal to a digital baseband signal;
 a digital processor connected to the digital demodulator, for filtering the digital baseband signal using bit-serial digital processing, wherein the digital processor comprises:
  a bit-serial digital bandpass filter, for reducing the bandwidth of the digital baseband signal;
  a bit-serial digital de-emphasis filter connected to the bit-serial bandpass filter, for compensating for high frequency noise amplification in the digital baseband signal; and
  a bit-serial digital expandor connected to the bit-serial de-emphasis filter, for expanding the digital baseband signal; and
 a converter block connected to the digital processor, for converting the filtered digital baseband signal to an analog baseband signal.

7. An FM receiver according to claim 6 wherein the converter block comprises:

a pulse-width-modulation amplifier; and an audio speaker connected to the pulse-width-modulation amplifier.

8. An FM receiver according to claim 6 wherein the FM receiver front end comprises:

a heterodyne circuit, for stepping down the analog radio frequency signal to an analog intermediate frequency signal; and an intermediate frequency filter connected to the heterodyne circuit, for filtering the analog intermediate frequency signal.

9. A radiotelephone comprising:

an FM receiver comprising:
 A) a radio frequency front end having a heterodyne circuit for producing an analog intermediate frequency signal from an analog radio frequency signal;
 B) a digital demodulator connected to the radio frequency front end comprising:
  1) a hard limiter, for limiting the analog intermediate frequency signal to a limited intermediate frequency signal having two voltage levels;
  2) a direct phase digitizer connected to the hard limiter, for producing a digital phase word from the limited intermediate frequency signal; and
  3) a phase differential circuit connected to the direct phase digitizer, for producing a digital phase differential word from the digital phase word;
 C) a digital processor connected to the digital demodulator comprising:
  1) a bit-serial digital bandpass filter, for reducing the bandwidth of the digital phase differential word;
  2) a bit-serial digital de-emphasis filter connected to the bit-serial digital bandpass filter, for compensating for high frequency noise amplification; and
  3) a bit-serial digital expandor connected to the bit-serial digital de-emphasis filter, for expanding the digital phase differential word to produce a digital signal; and
 D) a pulse-width-modulation audio amplifier connected to the digital processor for converting the digital signal to a pulse-width-modulated signal.

10. A radiotelephone according to claim 9 further comprising:

an audio speaker connected to the pulse-width-modulation audio amplifier for converting the pulse-width-modulated signal into an audio signal.

11. A radiotelephone according to claim 9 wherein the digital phase differential word is one bit longer than the digital phase word.

12. A method for receiving FM signals comprising the steps of:

A) stepping down an analog radio frequency signal to produce an analog intermediate frequency signal;

B) digitally demodulating the analog intermediate frequency signal to produce a digital baseband signal comprising the steps of:
 1) limiting the analog intermediate frequency signal to a limited intermediate frequency signal having two voltage levels;
 2) directly digitizing the limited intermediate frequency signal to produce a digital phase word; and
 3) taking a differential of the digital phase word to produce a digital phase differential word;

C) digitally processing the digital phase differential word comprising the steps of:
 1) bit-serially bandpass filtering the digital phase differential word;
 2) bit-serially de-emphasis filtering the digital phase differential word; and
 3) bit-serially expanding the digital phase differential word to produce a digital signal; and D) converting the digital signal to an audio signal.

13. An FM receiver back end comprising:

a demodulator, for demodulating an analog intermediate frequency signal to a digital baseband signal;

a digital processor connected to the digital demodulator, for filtering the digital baseband signal using bit-serial digital processing, wherein the digital processor comprises;
 a bit-serial digital bandpass filter, for reducing the bandwidth of the digital baseband signal;
 a bit-serial digital de-emphasis filter connected to the bit-serial bandpass filter, for compensating for high frequency noise amplification in the digital baseband signal; and
 a bit-serial digital expandor connected to the bit-serial de-emphasis filter, for expanding the digital baseband signal; and a converter block connected to the digital processor, for converting the digital baseband signal to an analog baseband signal.

* * * * *